United States Patent
Patapoutian

(10) Patent No.: US 6,615,361 B1
(45) Date of Patent: Sep. 2, 2003

(54) OBTAINING A PHASE ERROR OF A CLOCK SIGNAL

(75) Inventor: Ara Patapoutian, Westborough, MA (US)

(73) Assignee: Maxtor Corporation, Longmont, CO (US)

(*) Notice: Subject to any disclaimer, the term of this patent is extended or adjusted under 35 U.S.C. 154(b) by 0 days.

(21) Appl. No.: 09/518,001

(22) Filed: Mar. 2, 2000

(51) Int. Cl.[7] .................................................. G06F 1/04
(52) U.S. Cl. ........................................ 713/503; 713/401
(58) Field of Search .................................. 713/400, 401, 713/503, 500, 501, 600

(56) References Cited

U.S. PATENT DOCUMENTS

| | | | | | |
|---|---|---|---|---|---|
| 5,778,217 A | * | 7/1998 | Kao | ............................ | 713/503 |
| 5,966,258 A | * | 10/1999 | Bliss | ............................ | 360/46 |
| 6,088,829 A | * | 7/2000 | Umemura et al. | .......... | 714/798 |
| 6,108,151 A | * | 8/2000 | Tuttle et al. | .................... | 360/51 |
| 6,208,481 B1 | * | 3/2001 | Spurbeck et al. | ............. | 360/65 |
| 6,307,696 B1 | * | 10/2001 | Bishop et al. | ................ | 360/51 |

OTHER PUBLICATIONS

Aghamohammadi et al., "Adaptive synchronization and Channel Parameter Estimation Using an Extended Kalman Filter" IEEE Transactions On Communications (37)11:1212–1219, 1989.
Christiansen "Modeling Of A PRML Timing Loop As A Kalmanfilter" 1994 IEEE GlobeCom, San Francisco.
Driessen, "DPLL Bit Synchronizer with Rapid Acquisition Using Adaptive Kabnan Filtering Techniques" IEEE Transactions On Communications 42(9):2673–2675, 1994.
Patapoutian "On Phase–Lock Loops and Kalman Filters" IEEE Transactions On Communications 47(5):670–672, 1999.
Polk et al., "Quasi–optimal Digital Phase–Locked Loops" IEEE Transactions On Communications 21(1):75–82, 1973.

* cited by examiner

*Primary Examiner*—Dennis M. Butler
(74) *Attorney, Agent, or Firm*—David M. Sigmond

(57) ABSTRACT

A phase error of a clock signal is obtained by obtaining a data signal based on the clock signal, determining the phase error of the clock signal based on the data signal, and correcting the phase error of the clock signal using information that is determined based on the data signal.

59 Claims, 6 Drawing Sheets

OBTAINING A PHASE ERROR OF A CLOCK SIGNAL

TECHNICAL FIELD

This invention relates generally to obtaining a phase error of a clock signal-and, more particularly, to using that phase error to correct the phase of the clock signal.

BACKGROUND

Phase-locked loops (PLLs) operate in a control system, such as a disk drive, to synchronize the system and to reduce signal-to-noise (SNR) ratios in the system. In a disk drive, an analog signal is read from a storage medium, such as a computer hard disk, and is digitized using an analog-to-digital (A/D) converter. A clock signal clocks the A/D converter at specified points in the analog signal to produce the digital signal. If the clock signal is out of phase with the analog signal, noise may result in the digital signal.

A PLL is used to reduce phase errors between the analog signal and the clock signal. The PLL includes a phase detector, which detects phase errors in the digital signal. A filter filters these phase errors to obtain an overall phase error and controls the clock signal based on this overall phase error. Coefficients in the filter determine the amount of weight that individual phase errors are to be given in the filtering process.

SUMMARY

In one aspect, the invention relates to obtaining a phase error of a clock signal. This aspect of the invention obtains a data signal based on the clock signal, determines the phase error of the clock signal based on the data signal, and corrects the phase error of the clock signal using information that is determined based on the data signal.

Among the advantages of this aspect of the invention may be one or more of the following. Information from the data signal, such as its slope, contains timing information that can be used to correct the phase error of the clock signal. For example, using the slope, it is possible to weight phase errors at particular points in the data signal, such as at data points, more heavily than phase errors at other points in the data signal. As a result, the corrected phase error can reflect a weighted average that reduces the effects of noise and the like in the phase error.

This aspect of the invention may include one or more of the following features and/or functions. The phase error is determined by obtaining an ideal waveform of the data signal and determining a difference in phase between the data signal and the ideal waveform. The information used in correcting the phase error includes coefficients which are determined based on the data signal.

The coefficients are determined by obtaining an ideal waveform of the data signal, calculating a slope of the ideal waveform, and determining the coefficients based on the slope of the ideal waveform. The coefficients are determined by determining an amplitude error of the ideal waveform, determining the phase error of the clock signal based on the slope and the amplitude error, and determining the coefficients based on the phase error.

The phase error of the clock signal is corrected using a proportional-integral filter having a first coefficient ($\alpha$) and a second coefficient ($\beta$) that are determined using the data signal. The values for the first and second coefficients are determined based on a phase error and a frequency error associated with the data signal. The values for the first and second coefficients are determined using a covariance matrix that is based on the phase error and the frequency error.

The process for correcting the phase error includes reading data from a storage medium, processing the data, and sampling the processed data using the clock signal to obtain the data signal. The information used in correcting the phase angle error is obtained from a look-up table based on one or more values derived from the phase error.

The details of one or more embodiments of the invention are set forth in the accompanying drawings and the description below. Other features and advantages of the invention will be apparent from the description, drawings and claims.

DETAILED DESCRIPTION

Figure 1:
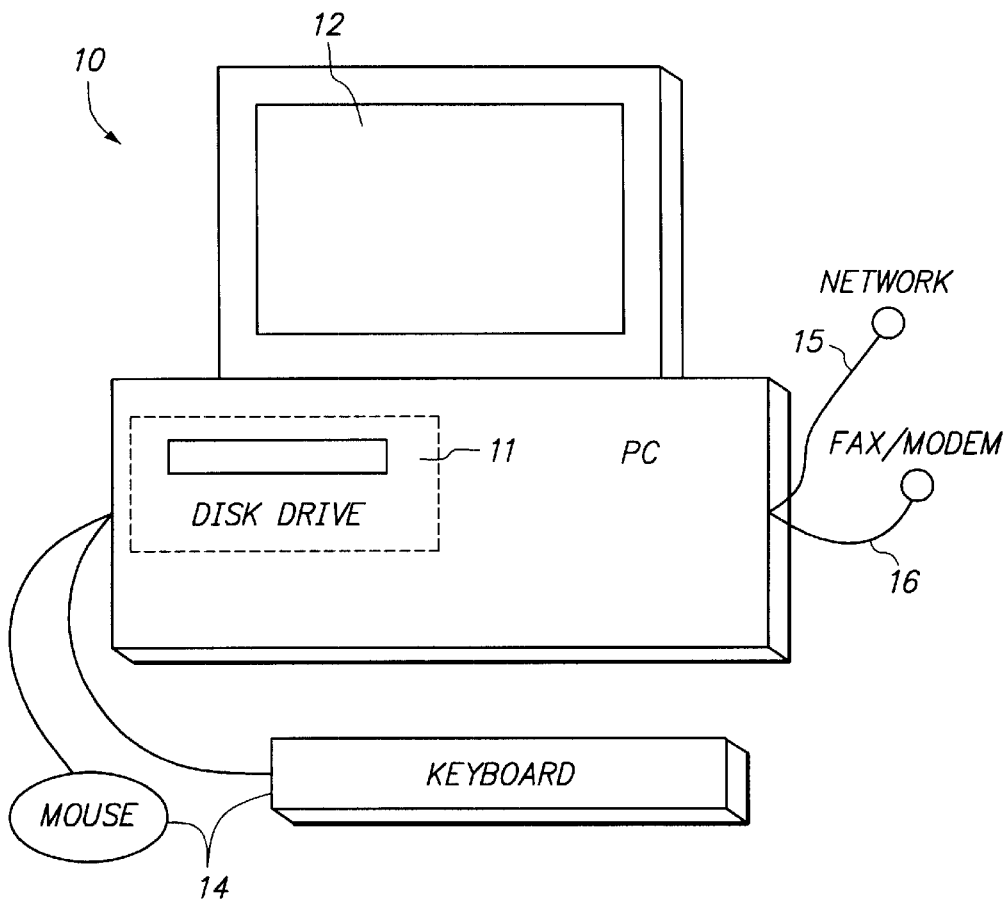
FIG. 1 is a perspective view of a personal computer that includes a disk drive.

FIG. 1 shows a personal computer (PC) 10. PC 10 includes a disk drive 11, a display screen 12 which displays information to a user, and input devices 14 which input data. Network interface 15 and fax/modem interface 16 are also provided which connect PC 10 to a network (not shown).

Figure 2:
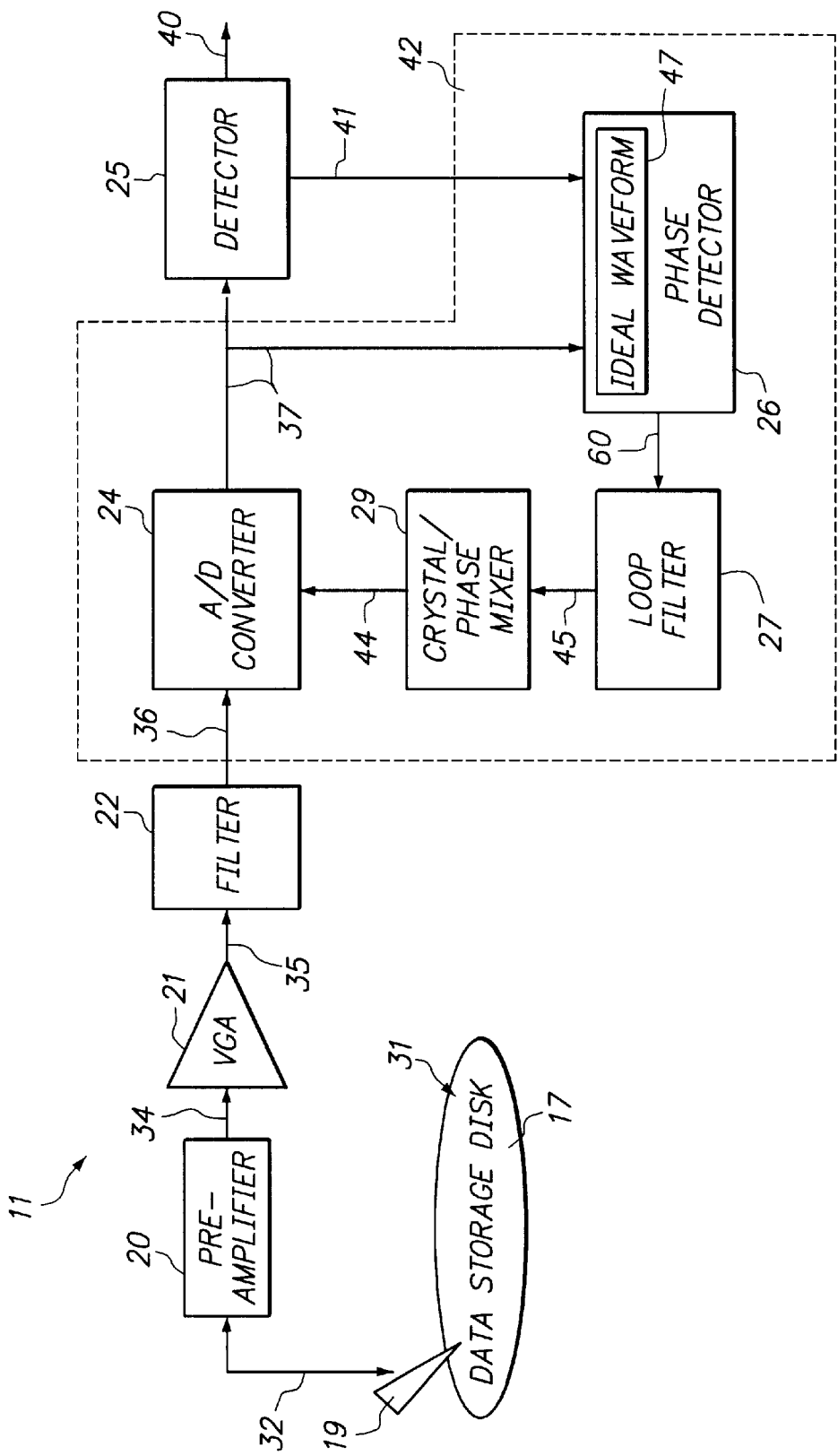
FIG. 2 is a block diagram showing representative components of the disk drive.

FIG. 2 shows components of disk drive 11. Among the components of disk drive 11 are data storage disk 17, transducer head 19, pre-amplifier 20, analog variable gain amplifier (VGA) 21, filter 22, A/D converter 24, detector 25, phase detector 26, loop filter 27, and crystal/phase mixer 29 (which may be a single component or separate components).

Figure 3:
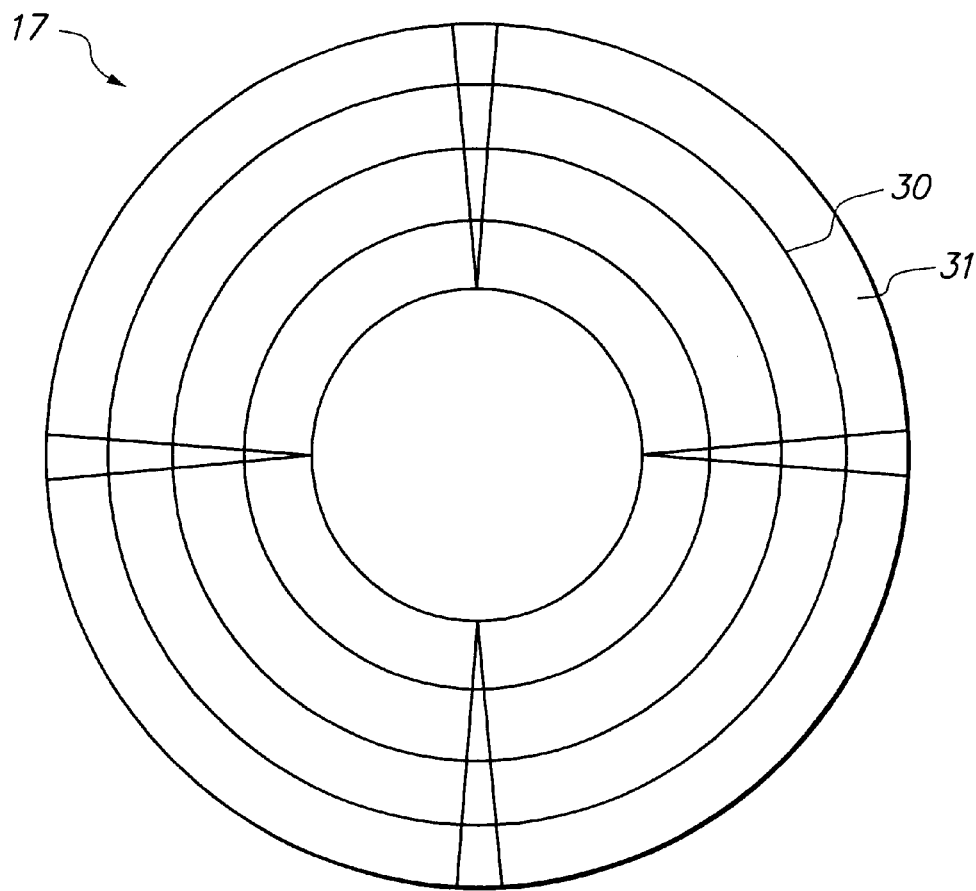
FIG. 3 is a top view of a computer storage disk in the disk drive.

Data storage disk 17 is a magnetic disk having concentric data storage tracks defined on one or both of its storage surfaces. A close-up view of these tracks 30 is shown in FIG. 3. Data storage disk 17 is rotated inside disk drive 11 while data is read from/written to its tracks. Although only one data storage disk 17 is shown, more than one disk may be included in disk drive 11.

Transducer head 19 may include a giant magneto-resistive (GMR) read element (or similar device) and is capable of reading data from, and writing data to, data storage disk 17. Transducer head 19 is associated in a "flying" relationship over a storage surface 31 of disk 17, meaning that it is movable relative to, and over, storage surface 31 in order to read and write data on storage surface 31.

During reading, head 19 senses flux transitions as it "flies" in close proximity to a selected track on disk 17. These flux transitions 32 are provided to pre-amplifier 20. Pre-amplifier 20 is a voltage pre-amplifier that amplifies the flux transitions from millivolts (mV) to volts (V). Resulting pre-amplified analog signal (or "read" signal) 34 is provided to VGA 21. VGA 21 further amplifies read signal 34 and provides a resulting amplified read signal 35 to filter 22.

Filter 22 is an analog filter that equalizes amplified read signal 35. To this end, filter 22 is programmed in accordance with the data transfer rate of a data zone on disk 17 from which signal 35 ultimately originated. Resulting filtered signal 36 is subjected to sampling and quantization within high-speed A/D converter 24. A/D converter 24 outputs digitized signal 37 generated from signal 36.

Data stored on disk 17 may be coded prior to storage using an error detection code (EDC), which means that digitized signal 37 may also be coded. Detector 25 is a Viterbi detector which decodes (i.e., removes) intersymbol (ISI) interference in digitized signal 37. Detector 25 makes both-final bit decisions 40 and fast bit decisions 41. Accuracy is more important than speed in the final bit decisions, whereas speed is more important than accuracy in the fast bit decisions. There are two reasons for this. First, the final bit decisions are used in generating the output of disk drive 11 and, therefore, should be as accurate as possible. Second, the fast bit decisions are used in feedback PLL 42; hence, time delays should be reduced as much as possible. The fast bit decisions, unlike the final bit decisions, are therefore made in detector 25 without common noise reduction processing.

Phase detector 26 receives fast bit decisions 41 from detector 25, along with the digitized signal 37 output from A/D converter 24. Phase detector 26 determines phase errors, meaning phase differences, between "fast" bits 41 and the output bits in digitized signal 37 from A/D converter 24. These phase errors correspond to phase errors of clock signal 44 at various points of signal 36.

Phase detector 26 uses an ideal waveform determined from the fast bits 41 to obtain the phase error. Phase detector 26 also determines slopes along pre-selected points of the ideal waveform and uses the slopes to find a phase error between digitized signal 37 and fast bit decisions 41. The slopes are also provided to loop filter 27, which uses the slopes to filter the phase errors provided by phase detector 26. The resulting filtered phase errors 45 are used to correct the phase of clock signal 44 that is output by crystal/phase mixer 29 to clock A/D converter 24. The slopes determine the weights to be assigned to phase error values during the filtering process performed by loop filter 27. By assigning weights to the phase errors, it is possible to ensure that some phase errors are given more weight than others during the filtering process. The filtering process is described below.

Figure 4:
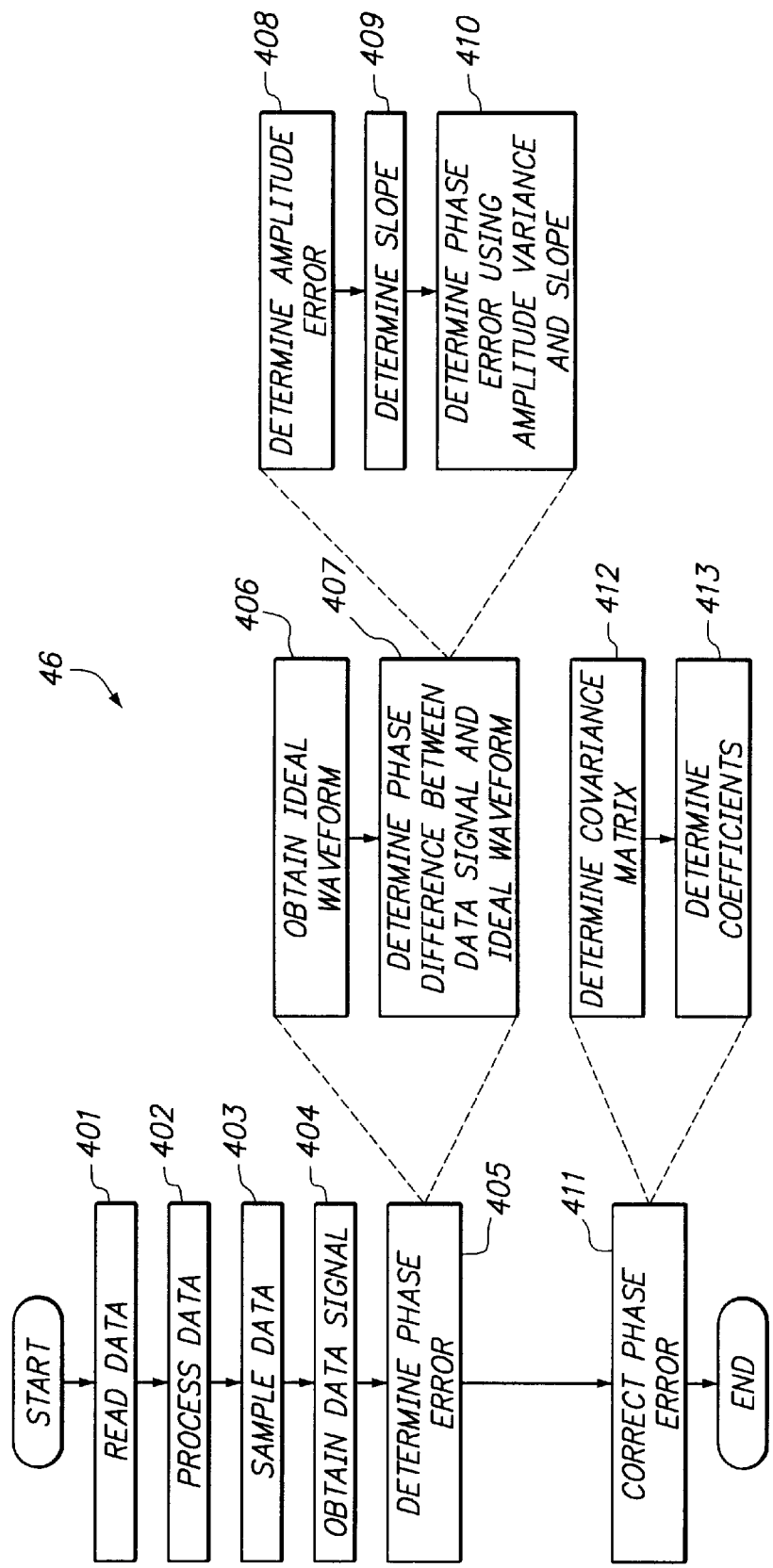
FIG. 4 is a flow diagram showing a process for correcting a phase error of a clock signal in the disk drive.

Referring to FIG. 4, a process 46 is shown for obtaining the phase error of clock signal 44 and for correcting that phase error. Process 46 is implemented using the circuitry shown in FIG. 2; however, it can be implemented using any type of hardware, software, or combination thereof.

Process 46 reads (401) data from storage medium 17 using transducer head 19, processes (402) the read data using pre-amplifier 20, VGA 21 and filter 22, and samples (403) the processed data in accordance with clock signal 44 using A/D converter 24. The resulting digitized signal 37 is obtained (404) from A/D converter 24 and output to detector 25 and phase detector 26. Detector 25 outputs final bits 40 to a disk drive controller (not shown) and outputs "fast bits" 41 to PLL 42, in particular, to phase detector 26.

Figure 5:
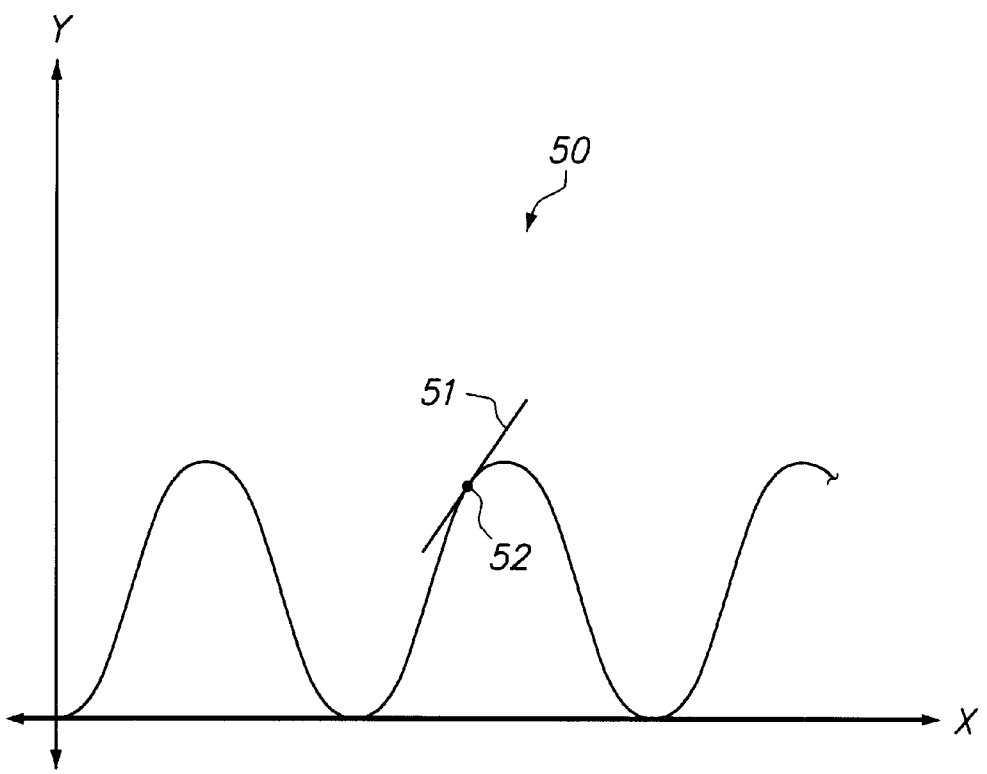
FIG. 5 shows an ideal waveform of data that is used to correct the phase terror of the clock signal.

Phase detector 26 determines (405) a phase error of clock signal 44. Ideal waveform generator 47 (FIG. 2) obtains (406) an ideal waveform from fast bits 41. This is done by reconstructing a substantially noiseless (or "ideal") waveform from the fast bits. Phase detector 26 determines (407) the phase difference between the ideal waveform and digitized signal 37 output by A/D converter 24 at various sampling points along the ideal waveform. An example of an ideal waveform 50 produced by ideal waveform generator 47 is shown in FIG. 5. To determine (407) the phase difference, phase detector 26 determines (408) an amplitude difference (or "error") between the ideal waveform and digitized signal 37 at a point in time. Phase detector 26 determines (409) the slope 51 at the point 52 where the amplitude error was determined.

The phase difference (or "error") is determined based on the amplitude error and the slope. More specifically, phase detector 26 determines (410) the phase error by multiplying the amplitude error and the slope for point 52.

The phase error and the slope are provided to loop filter 27. Loop filter 27 uses the phase error and the slope to determine a smoothed (e.g., averaged) phase error for ideal waveform 50. An average phase error is preferred over a single-phase error, since the averaging process reduces the effects of noise and other extraneous signals in the phase error. This phase error is used to correct (411) the phase of clock signal 44 output by crystal/phase mixer 29.

Figure 6:
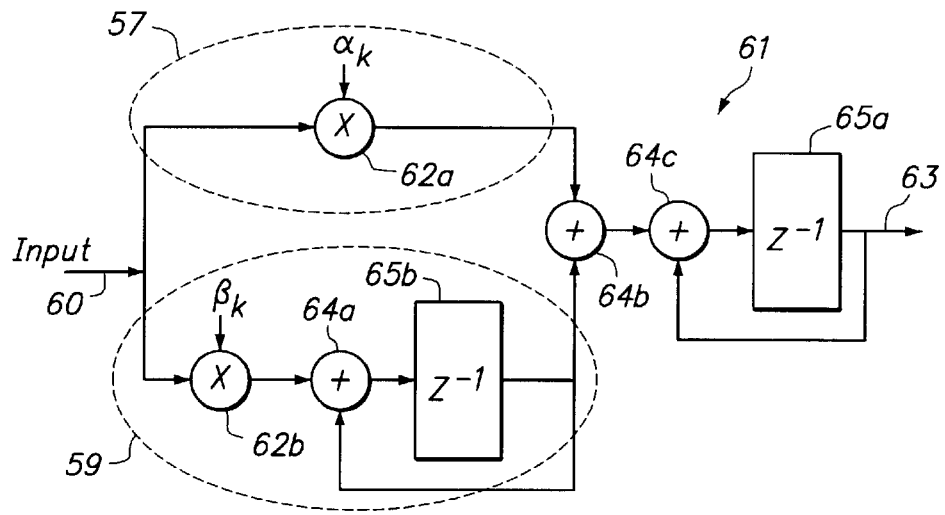
FIG. 6 is a block diagram of components of a filter in the disk drive that processes the phase error.

In this embodiment, loop filter 27 is a proportional integral (PI) filter that contains a proportional term and an integral term followed by an integrator term. As shown in FIG. 6, proportional term 57 multiplies the filter input by a first coefficient ($\alpha$) and integral term 59 uses a second coefficient ($\beta$) to integrate the inputs 60 to loop filter 27, namely the phase errors, over time. Coefficients $\alpha$ and $\beta$ are gains of loop filter 27 and are determined in accordance with the slope of the ideal waveform, as described below.

As shown in FIG. 6, the outputs from integral term 57 and proportional term 59 are added and the resulting sum is integrated in second integral term 61. The output 63 constitutes a weighted average of the inputs 60 to loop filter 27. In FIG. 6, "X" blocks 62a and 62b indicate multiplication; "+" blocks 64a, 64b and 64c indicate addition; and $Z^{-1}$ blocks 65a and 65b indicate delays blocks. These blocks may be implemented using multiplier, adder and buffer circuits, respectively, or, e.g., flip-flops or the like.

Figure 7:
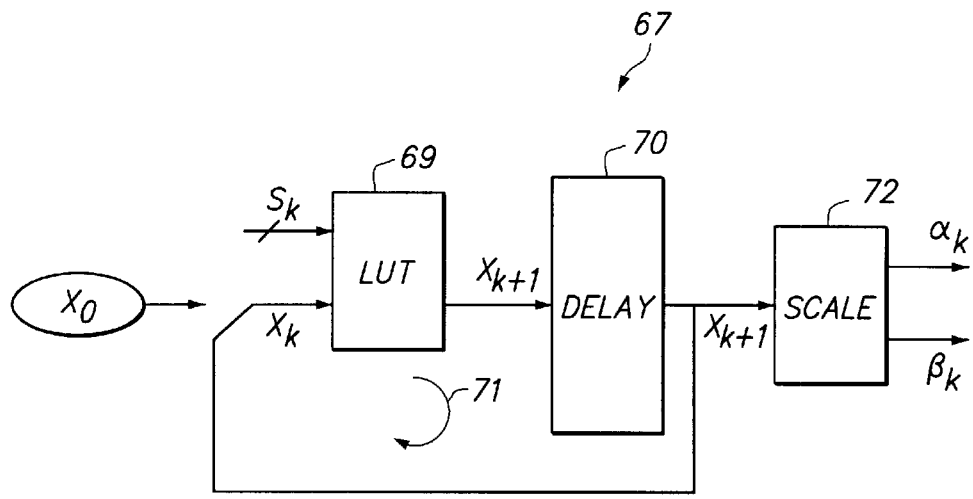
FIG. 7 is a block diagram of components of the filter which obtain filter coefficients based on a slope of the ideal waveform.

FIG. 7 shows a block diagram 67 of circuitry or software in loop filter 27 for determining values of $\alpha$ and $\beta$ at times k. Filter coefficients $\alpha$ and $\beta$ are updated using values stored in look-up table (LUT) 69. These values are derived from the phase errors provided by phase detector 26 using Extended Kalman Filtering (EKF) theory. In this embodiment, EKF uses the covariance matrix X of phase ($\theta$) and frequency (f) errors of clock signal 44 to determine the values of $\alpha$ and $\beta$. The phase errors ($\theta_k$) are determined by phase detector 26 and the frequency errors ($f_k$) are determined in phase detector 26 by differentiating $\theta$ with respect to time.

Values for the covariance matrix X at times k, namely $X_k$, are determined (412) in accordance with the following EKF equations, where "E" denotes the probabilistic expectation operation:

$$X_k = E[(\theta_k - \theta'_k)^2] E[(\theta_k - \theta'_k)(f_k - f'_k)] E[(\theta_k - \theta'_k)(f_k - f'_k)] E[(f_k - f'_k)^2],$$

where $\theta_k$ is the actual phase error at time k, $\theta'_k$ is an estimated phase error for time k, $f_k$ is the actual frequency error at time k, $f'_k$ is an estimated frequency error for time k, $E[(\theta_k - \theta'_k)^2]$ is the variance phase error, $E[(f_k - f'_k)^2]$ is the variance frequency error, and $E[(\theta_k - \theta'_k)(f_k - f'_k)]$ is the expected phase and frequency correlation. Values for $\theta'_k$ and $f'_k$ are estimated based on previous values of $\theta_k'$ and $f_k'$, respectively.

These values of $X_k$ and the slope at time k, namely $S_k$, are used to obtain values for a subsequent covariance matrix $X_{k+1}$ from LUT 69. Initial values $X_0$ are set using predetermined phase and frequency standard deviation values, such as 0.08 and 0.0002, respectively. The standard deviation is the square root of the variance, which is determined using the expectation operation "E" noted above. For example, the initial $X_0$ matrix may be as follows

| $(0.08)^2$ | 0 |
|---|---|
| 0 | $(0.0002)^2$ |

These values may be determined based on measured parameters of disk drive 11, or they may be estimated, and then stored in LUT 69. Slope values $S_k$ and values for covariance matrix $X_k$ are used to select new values for $X_{k+1}$ from LUT 69.

By using the slope $S_k$ to select new covariance matrix values $X_{k+1}$ from LUT 69, it is possible to select values which produce $\alpha$ and $\beta$ values that correspond to $S_k$. More specifically, the output of LUT 69, $X_{k+1}$, is provided to delay circuit 70. Delay circuit 70 feeds $X_{k+1}$ back to LUT 69 through feedback loop 71 and outputs $X_{k+1}$ to scale block 72. Scale block 72 performs a matrix multiplication operation on the values of $X_k$ to determine (413) values for coefficients $\alpha_k$ and $\beta_k$. The matrix multiplier used in scale block 72 may vary, depending upon system parameters and the desired relationship between the values of $X_k$ and those for $\alpha_k$ and $\beta_k$.

The relationship between the output $X_{k+1}$ of LUT 69 and the input $X_k$ and $S_k$ of LUT 69 is as follows:

$$X_{k+1} = [(FX_k F^T + \sigma_w^2)^{-1} + (C^T C / \sigma_v^2) S_k^2]^{-1},$$

where

| F is the matrix | 1 | 1 |
|---|---|---|
| | 0 | 1, |

$\sigma_w^2$ is the system process noise variance,
$\sigma_v^2$ is the system observation noise variance, and
C is the matrix [1 0].

Values for the F and C matrices may be different than those shown above. Observation noise is noise in disk drive 11, such as electronic noise or jitter, that has an adverse effect on data read from storage medium 17. Process noise is the rate at which the phase error of the clock signal changes over time. To determine values for LUT 69, values of $X_{k+1}$ are determined beforehand for predetermined values of $X_k$ and $S_k$. These values are stored in LUT 69 for later use.

Referring back to FIGS. 2 and 6, once values for $\alpha_k$ and $\beta_k$ are determined, they are provided to multipliers 62a and 62b of loop filter 27. Loop filter 27 uses these values to determine the phase error 45 of clock signal 44, as described above. This phase error is provided to crystal/phase mixer 29, where it is used to correct the phase of clock signal 44. Specifically, crystal/phase mixer 29 outputs a clock signal that is shifted in phase by the amount of the phase error. The process then continues to correct the phase error based on newly-measured slope ($S_k$) values.

The invention can be implemented using any type of circuitry and/or software. For example, an application-specific integrated circuit (ASIC) may be designed to perform the functions of loop filter 27. Using an ASIC reduces the amount of hardware that must be included in disk drive 11 and permits the coefficients $\alpha_k$ and $\beta_k$ to be determined "on-the-fly" as described above. On the other hand, the invention can be implemented solely in software, as computer-executable instructions stored on a computer-readable medium.

The invention is also not limited to the specific EKF equations described above. Rather, any filtering processes may be used which incorporate the slope of the incoming data signal in the filtering process. The invention is also not limited to the disk drive system shown in FIG. 2. In fact, it can be used in any PLL that is used to correct phase errors in any type of feedback system.

Other embodiments not described herein are also within the scope of the following claims.

What is claimed is:

1. A method of obtaining a phase error of a clock signal, comprising:
    obtaining a data signal based on the clock signal;
    determining the phase error of the clock signal based on the data signal;
    determining coefficients based on the data signal, wherein determining the coefficients comprises:
        obtaining an ideal waveform of the data signal;
        calculating a slope of the ideal waveform; and
        determining the coefficients based on the slope of the ideal waveform; and
    correcting the phase error of the clock signal using information that is determined based on the data signal, wherein correcting is performed using a filter and the information comprises the coefficients that correspond to gains of the filter.

2. The method of claim 1, wherein determining the coefficients comprises:
    determining an amplitude error of the ideal waveform; and
    determining the coefficients using the amplitude error.

3. The method of claim 1, wherein correcting is performed using a proportional-integral filter having a first coefficient ($\alpha$) and a second coefficient ($\beta$) that are determined based on the data signal.

4. The method of claim 3, further comprising determining values for the first and second coefficients based on a phase error and a frequency error associated with the data signal.

5. The method of claim 4, further comprising determining a covariance matrix based on the phase error and the frequency error, wherein the values for the first and second coefficients are based on the covariance matrix.

6. The method of claim 1, further comprising:
    reading data from a storage medium;
    processing the data; and
    sampling the processed data using the clock signal to obtain the data signal.

7. The method of claim 1, further comprising obtaining the information from a look-up table based on one or more values derived from the phase error.

8. A computer program stored on a computer-readable medium for obtaining a phase error of a clock signal, the computer program comprising computer-executable instructions that cause a computer to:
    obtain a data signal based on the clock signal;
    determine the phase error of the clock signal based on the data signal; and
    correct the phase error of the clock signal using information that is determined based on the data signal;
    wherein correcting is performed using a filter and the information comprises coefficients that correspond to gains of the filter, the coefficients are determined based on the data signal, and determining the coefficients comprises:

obtaining an ideal waveform of the data signal;
calculating a slope of the ideal waveform; and
determining the coefficients based on the slope of the ideal waveform.

9. The computer program of claim 8, wherein determining the coefficients comprises:
determining an amplitude error of the ideal waveform; and
determining the coefficients using the amplitude error.

10. The computer program of claim 8, wherein correcting is performed using a proportional-integral filter having a first coefficient ($\alpha$) and a second coefficient ($\beta$) that are determined based on the data signal.

11. The computer program of claim 10, further comprising instructions that cause the computer to determine values for the first and second coefficients based on a phase error and a frequency error associated with the data signal.

12. The computer program of claim 11, further comprising instructions that cause the computer to determine a covariance matrix based on the phase error and the frequency error, wherein the values for the first and second coefficients are based on the covariance matrix.

13. The computer program of claim 8, further comprising instructions that cause the computer to:
read data from a storage medium;
process the data; and
sample the processed data using the clock signal to obtain the data signal.

14. The computer program of claim 8, wherein the information is obtained from a look-up table based on one or more values derived from the phase error.

15. An apparatus for obtaining a phase error of a clock signal, comprising:
circuitry which obtains a data signal based on the clock signal;
a phase detector which determines the phase error of the clock signal based on the data signal; and
a filter which corrects the phase error of the clock signal using information that is determined based on the data signal;
wherein the information comprises coefficients that correspond to gains of the filter, the coefficients are determined based on the data signal, and the filter determines the coefficients by:
obtaining an ideal waveform of the data signal;
calculating a slope of the ideal waveform; and
determining the coefficients based on the slope of the ideal waveform.

16. The apparatus of claim 15, wherein the filter determines the coefficients by:
determining an amplitude error of the ideal waveform; and
determining the coefficients using the amplitude error.

17. The apparatus of claim 15, wherein the filter comprises a proportional-integral filter having a first coefficient ($\alpha$) and a second coefficient ($\beta$) that are determined based on the data signal.

18. The apparatus of claim 17, wherein the filter determines values for the first and second coefficients based on a phase error and a frequency error associated with the data signal.

19. The apparatus of claim 18, wherein the filter determines a covariance matrix based on the phase error and the frequency error, and wherein the values for the first and second coefficients are based on the covariance matrix.

20. The apparatus of claim 15, further comprising:
circuitry which reads data from a storage medium;
circuitry which processes the data; and
an analog-to-digital converter which samples the processed data using the clock signal to obtain the data signal.

21. The apparatus of claim 15, wherein the information is obtained from a look-up table based on one or more values derived from the phase error.

22. A method of obtaining a phase error of a clock signal, comprising:
obtaining a data signal based on the clock signal;
determining the phase error of the clock signal based on the data signal; and
correcting the phase error of the clock signal using information that is determined based on the data signal, wherein correcting is performed using a proportional-integral filter having a first coefficient ($\alpha$) and a second coefficient ($\beta$) that are determined based-on the data signal.

23. The method of claim 22, wherein determining the phase error comprises:
obtaining an ideal waveform of the data signal; and
determining a difference in phase between the data signal and the ideal waveform, the difference in phase corresponding to the phase error.

24. The method of claim 22, further comprising determining values for the first and second coefficients based on a phase error and a frequency error associated with the data signal.

25. The method of claim 24, further comprising determining a covariance matrix based on the phase error and the frequency error, wherein the values for the first and second coefficients are based on the covariance matrix.

26. The method of claim 26, further comprising:
reading data from a storage medium;
processing the data; and
sampling the processed data using the clock signal to obtain the data signal.

27. The method of claim 22, further comprising obtaining the information from a look-up table based on one or more values derived from the phase error.

28. A computer program stored on a computer-readable medium for obtaining a phase error of a clock signal, the computer program comprising computer-executable instructions that cause a computer to:
obtain a data signal based on the clock signal;
determine the phase error of the clock signal based on the data signal; and
correct the phase error of the clock signal using information that is determined based on the data signal, wherein correcting is performed using a proportional-integral filter having a first coefficient ($\alpha$) and a second coefficient ($\beta$) that are determined based on the data signal.

29. The computer program of claim 28, wherein determining the phase error comprises:
obtaining an ideal waveform of the data signal; and
determining a difference in phase between the data signal and the ideal waveform, the difference in phase corresponding to the phase error.

30. The computer program of claim 28, further comprising instructions that cause the computer to determine values for the first and second coefficients based on a phase error and a frequency error associated with the data signal.

31. The computer program of claim 30, further comprising instructions that cause the computer to determine a covariance matrix based on the phase error and the frequency error, wherein the values for the first and second coefficients are based on the covariance matrix.

32. The computer program of claim 28, further comprising instructions that cause the computer to:
   read data from a storage medium;
   process the data; and
   sample the processed data using the clock signal to obtain the data signal.

33. The computer program of claim 28, wherein the information is obtained from a look-up table based on one or more values derived from the phase error.

34. An apparatus for obtaining a phase error of a clock signal, comprising:
   circuitry which obtains a data signal based on the clock signal;
   a phase detector which determines the phase error of the clock signal based on the data signal; and
   a filter which corrects the phase error of the clock signal using information that is determined based on the data signal, wherein the filter comprises a proportional-integral filter having a first coefficient ($\alpha$) and a second coefficient ($\beta$) that are determined based on the data signal.

35. The apparatus of claim 34, wherein the phase detector determines the phase error by:
   obtaining an ideal waveform of the data signal; and
   determining a difference in phase between the data signal and the ideal waveform, the difference in phase corresponding to the phase error.

36. The apparatus of claim 34, wherein the filter determines values for the first and second coefficients based on a phase error and a frequency error associated with the data signal.

37. The apparatus of claim 36, wherein the filter determines a covariance matrix based on the phase error and the frequency error, wherein the values for the first and second coefficients are based on the covariance matrix.

38. The apparatus of claim 34, further comprising:
   circuitry which reads data from a storage medium;
   circuitry which processes the data; and
   an analog-to-digital converter which samples the processed data using the clock signal to obtain the data signal.

39. The apparatus of claim 34, wherein the formation is obtained from a look-up table based on one or more values derived from the phase error.

40. A method of obtaining a phase error of a clock signal, comprising:
   obtaining a data signal based on the clock signal;
   determining the phase error of the clock signal based on the data signal;
   adjusting gain coefficients of a filter based on a slope associated with the data signal; and
   correcting the phase error using the filter.

41. The method of claim 40, wherein the slope is obtained from the data signal.

42. The method of claim 40, wherein the slope is obtained from an ideal waveform obtained from the data signal.

43. The method of claim 40, wherein adjusting the coefficients weighs phase errors at particular points in the data signal more heavily than phase errors at other points in the data signal.

44. The method of claim 40, further comprising adjusting the coefficients based on a phase error and a frequency error associated with the data signal.

45. The method of claim 44, further comprising determining a covariance matrix based on the phase error and the frequency error, wherein the values for the coefficients are based on the covariance matrix.

46. The method of claim 40, wherein the filter is a proportional-integral filter.

47. The method of claim 46, wherein the filter includes a proportional term and an integral term followed by an integrator term.

48. The method of claim 40, further comprising:
   reading data from a storage medium;
   processing the data; and
   sampling the processed data using the clock signal to obtain the data signal.

49. The method of claim 48, wherein the storage medium is a hard disk.

50. A method of obtaining a phase error of a clock signal, comprising:
   obtaining a data signal based on the clock signal;
   determining the phase error of the clock signal based on the data signal;
   obtaining an ideal waveform of the data signal;
   detecting an amplitude error in the ideal waveform;
   determining a slope of the ideal waveform where the amplitude error is detected;
   adjusting gain coefficients of a filter based on the slope and the amplitude error; and
   correcting the phase error using the filter.

51. The method of claim 50, wherein the ideal waveform is a substantially noiseless reconstructed version of the data signal.

52. The method of claim 50, further comprising adjusting the gain coefficients based on a multiplication of the slope and the amplitude error.

53. The method of claim 50, wherein adjusting the coefficients weighs phase errors at particular points in the data signal more heavily than phase errors at other points in the data signal.

54. The method of claim 50, further comprising adjusting the coefficients based on a phase error and a frequency error associated with the data signal.

55. The method of claim 54, further comprising determining a covariance matrix based on the phase error and the frequency error, wherein the values for the coefficients are based on the covariance matrix.

56. The method of claim 50, wherein the filter is a proportional-integral filter.

57. The method of claim 56, wherein the filter includes a proportional term and an integral term followed by an integrator term.

58. The method of claim 50, further comprising:
   reading data from a storage medium;
   processing the data; and
   sampling the processed data using the clock signal to obtain the data signal.

59. The method of claim 58, wherein the storage medium is a hard disk.

* * * * *